US010775302B2

(12) United States Patent
Zhao et al.

(10) Patent No.: US 10,775,302 B2
(45) Date of Patent: Sep. 15, 2020

(54) TERAHERTZ DETECTOR (71) Applicant: NUCTECH COMPANY LIMITED, Beijing (CN)

(72) Inventors: Ziran Zhao, Beijing (CN); Haifan Hu, Beijing (CN); Xuming Ma, Beijing (CN); Yingxin Wang, Beijing (CN)

(73) Assignee: NUCTECH COMPANY LIMITED, Beijing (CN)

(*) Notice: Subject to any disclaimer, the term of this patent is extended or adjusted under 35 U.S.C. 154(b) by 35 days.

(21) Appl. No.: 16/232,318

(22) Filed: Dec. 26, 2018

(65) Prior Publication Data
US 2019/0234870 A1 Aug. 1, 2019

(30) Foreign Application Priority Data

Dec. 29, 2017 (CN) .......................... 2017 1 1499067

(51) Int. Cl.
G01N 21/35 (2014.01)
G01J 1/44 (2006.01)
G01N 21/3581 (2014.01)
G01J 1/42 (2006.01)
G01J 1/04 (2006.01)

(52) U.S. Cl.
CPC ........ *G01N 21/3581* (2013.01); *G01J 1/0411* (2013.01); *G01J 1/42* (2013.01); *G01J 1/44* (2013.01); *G01J 2001/448* (2013.01); *G01J 2001/4466* (2013.01)

(58) Field of Classification Search
CPC ...... G01N 21/3581; G01J 1/0411; G01J 1/42; G01J 1/44; G01J 2001/448; G01J 2001/4466; H01L 31/115

USPC ......................................................... 250/207
See application file for complete search history.

(56) References Cited

U.S. PATENT DOCUMENTS 9,797,779 B2 * 10/2017 Ozyilmaz ............... G01J 5/046
9,851,455 B2 * 12/2017 Dolinsky ................ G01T 1/247
10,205,242 B2 * 2/2019 Mukai ....................... H01Q 9/16
10,571,574 B1 * 2/2020 Yavid ...................... G01S 17/42
2016/0258807 A1 9/2016 Pein et al.

FOREIGN PATENT DOCUMENTS

KR  10-2015-0043064 A   4/2015
WO  WO 2008/107718 A1   9/2008

OTHER PUBLICATIONS

Extended European Search Report as issued in European Patent Application No. 18248030.1, dated Jul. 9, 2019.
Sabaawi, et al., "Planar Bowtie Nanoarray for THz Energy Detection," IEEE Transactions on Teranertz Science and Technology, vol. 3, No. 5, Sep. 2013, pages 524-531.

* cited by examiner

*Primary Examiner* — Seung C Sohn
(74) *Attorney, Agent, or Firm* — Pillsbury Winthrop Shaw Pittman LLP (57) ABSTRACT The present disclosure provides a terahertz detector. The terahertz detector includes a planar array structure that is constituted by a plurality of pixel units, the plurality of pixel units each include N sub pixels and each of the sub pixels includes no more than one signal trigger configured to transform a terahertz signal to an electrical current pulsing signal, and each of the plurality of pixel units detects a signal that is a sum of the electrical current pulsing signals of the N sub pixels, where N is an integer greater than 1.

20 Claims, 8 Drawing Sheets

TERAHERTZ DETECTOR

CROSS-REFERENCE TO RELATED APPLICATION

This application claims the priority benefit of Chinese Patent Application No. 201711499067.4, titled "TERAHERTZ DETECTOR", filed with the State Intellectual Property Office of China on Dec. 29, 2017, the whole disclosure of which is incorporated herein by reference.

TECHNICAL FIELD

Embodiments of the present disclosure relate to the detection technical field, and particularly to a terahertz detector.

BACKGROUND

A terahertz wave is between a millimeter wave and an infrared wave and thus not only has a certain penetration ability like the millimeter wave but also has a relatively high resolving ability like an infrared wave. Thus, a terahertz wave can be used in security inspection of baggage, packages or other items as well as human body security inspection. Applications of the terahertz wave have developed gradually. However, there is currently lacking a method of efficiently generating a terahertz wave and an accurate detecting method using a terahertz wave. A terahertz detector is needed to be studied continuously.

Detection using a terahertz wave may be classified into two technology types, i.e., one is coherent detection and the other is non-coherent detection. Due to low output power of terahertz radiation, loss of transfer, heat radiation, noise, etc., a terahertz signal that is detectable is rather weak. Thus, there is a dire need for a terahertz detector with high sensitivity for the development of terahertz technology. In this context, many types of terahertz wave detectors are being developed. A heat radiation meter is a non-coherent detector that can detect power of radiation and is not able to report phase information. Further, this type detector commonly works at a low temperature in order to reduce detection noise. A pyroelectric transducer has a relative simple structure and operation, and may work in normal temperature. However, a response time of a pyroelectric transducer depends on a process of establishing a new balance temperature, that is, a pyroelectric transducer cannot detect a terahertz signal during changing of temperature. A Golay detector has a wide response frequency band, a low equivalent power of noise, a high response sensitivity and may operate at normal temperature. However, the Golay detector is sensitive to vibration and has bad stability as a whole. In addition, there is a counting type terahertz detector, such as a single electron transistor detector and a quantum cascade laser, which is mainly used to detect photons at a frequency of more than 1 THz while having no effect for a low energy photon at a frequency less than 1 THz. Further, the whole apparatus for a counting type terahertz detector is very expensive and needs to work at a super low temperature, and thus has a limited ability to be widely used.

SUMMARY

According to an aspect of the present disclosure, there is provided a terahertz detector including a planar array structure that is constituted by a plurality of pixel units, wherein the plurality of pixel units each include N sub pixels and each of the sub pixels includes no more than one signal trigger configured to transform a terahertz signal to an electrical current pulsing signal, and each of the plurality of pixel units detects a signal that is a sum of the electrical current pulsing signals of the N sub pixels, where N is an integer greater than 1.

In an embodiment, the N sub pixels of each of the pixel units are connected in parallel.

In an embodiment, each of the pixel units includes: a sensitive unit configured to transform a terahertz signal received to an electrical signal; and a Geiger avalanche photodiode, wherein the sensitive unit is electrically connected to the Geiger avalanche photodiode, and each of the sub pixels is configured: such that the Geiger avalanche photodiode is in an initial breakdown state under a bias voltage in a case where the sensitive unit receives no terahertz signal, and such that in a case where the sensitive unit receives a terahertz signal, the sensitive unit transforms the terahertz signal to an electrical signal that is detectable and the electrical signal is further transformed to a voltage signal and then is applied to the Geiger avalanche photodiode so as to excite the Geiger avalanche photodiode to avalanche and output a transient electrical current pulsing signal.

In an embodiment, each of the sub pixels further includes a quenching resistor, and the sensitive unit, the Geiger avalanche photodiode and the quenching resistor are connected in series, and each of the sub pixels is configured such that, in a case where a value of an electrical current in a circuit reaches a threshold value, a partial potential on the quenching resistor increases gradually, a partial potential on the avalanche photodiode decreases gradually and the avalanche photodiode restores to the initial avalanche state.

In an embodiment, the sensitive unit includes any one, or a combination of more than one, selected from a graphene material, a pyroelectricity material, a Schottky diode detector, and/or a high-speed electron mobility transistor.

In an embodiment, the sensitive unit includes the Schottky diode detector and the Schottky diode detector includes a diode body, and an anode and a cathode disposed on one side of the diode body.

In an embodiment, the anode and the cathode of the Schottky diode detector face towards the terahertz signal, the terahertz detector further includes a step on a surface of the Geiger avalanche photodiode and an electrode pad disposed on the step, and the anode of the Schottky diode detector is electrically connected to the electrode pad; or the anode and the cathode of the Schottky diode detector face towards the Geiger avalanche photodiode and the anode of the Schottky diode detector is electrically connected to the Geiger avalanche photodiode through the quenching resistor.

In an embodiment, the sensitive unit includes the high-speed electron mobility transistor and the high-speed electron mobility transistor includes a transistor body and a source electrode, drain electrode and a gate electrode disposed on a side face of the transistor body, wherein a side face of the transistor body of the high-speed electron mobility transistor faces towards the Geiger avalanche photodiode, or wherein a side face, on which the source electrode, the drain electrode and the gate electrode are not disposed, of the transistor body of the high-speed electron mobility transistor faces towards the Geiger avalanche photodiode.

In an embodiment, the sensitive unit includes an antenna having a microstructure configured to enhance a terahertz signal towards at least one point.

In an embodiment, the microstructure of the antenna is of a staircase structure, a pattern structure or a super material.

In an embodiment, the terahertz detector further includes a sensitive unit lens, through which the terahertz signal passes and impinges on the sensitive unit.

In an embodiment, the Geiger avalanche photodiode is made of a semiconductor material including silicon, gallium arsenide, gallium nitride, silicon carbide, graphene or indium phosphide.

In an embodiment, the terahertz detector further includes a passivation layer disposed between the sensitive unit and a quenching resistor.

In an embodiment, the quenching resistor includes a polysilicon material or other highly-resistant material.

DETAILED DESCRIPTION OF EXEMPLARY EMBODIMENTS

While various modifications and replacements may be allowed in the disclosure, embodiments are described and illustrated by reference to examples in the drawings in combination with the following text. However, it is understood that the attached drawings and the following description is not intended to limit the present disclosure to the embodiments, but on the contrary, is intended to cover any modifications, equivalents and replacements that fall into the scope and spirit protected by the attached claims. The drawings are provided to illustrate schematically, instead of being drawn in scale.

In the text, the terms such as "up", "down" are not intended to limit the absolute location of a component, but to make clear where it is located relative to other components. Terms such as "top (side)" and "lower (side)" are used in the text to show a top side or lower side with respect to a vertically-standing object.

A plurality of embodiments of the present disclosure are described as below.

Figure 1:
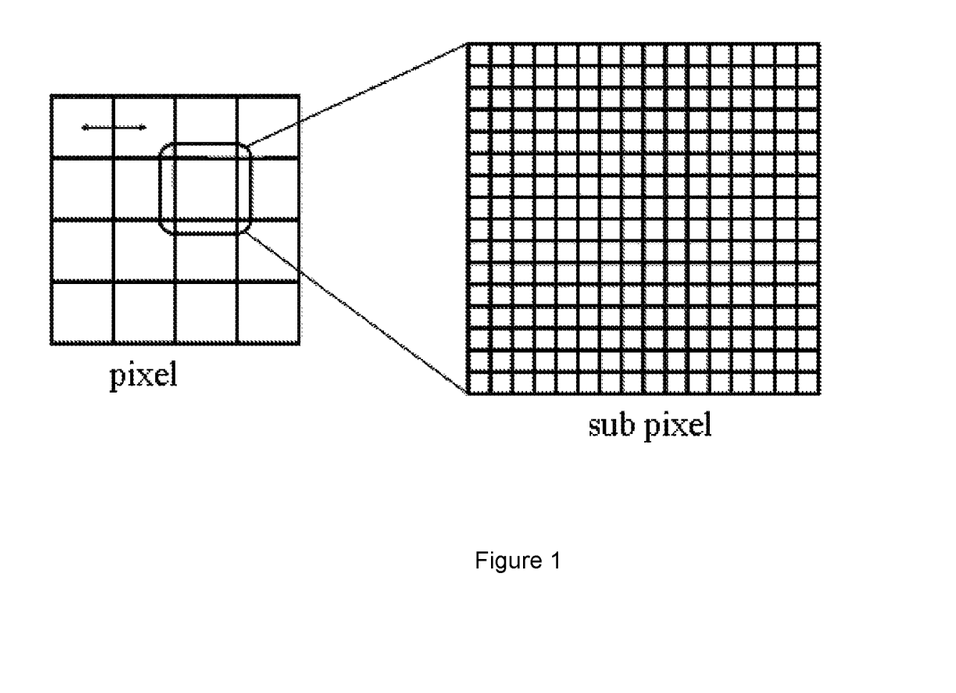
FIG. 1 shows schematic plan views of a planar array structure constituted by a plurality of pixel units and of each of the pixel units according to an embodiment of the present disclosure.

Referring to FIG. 1, schematic plan views of a planar array structure constituted by a plurality of pixel units and of each of the pixel units according to an embodiment of the present disclosure are illustrated. FIG. 1 schematically illustrates a relationship between the pixel units and a sub pixel of a counting-like type of terahertz detector according to an embodiment of the present disclosure. In FIG. 1, each of the pixel units may individually provide a signal, like a common image sensor (CMOS) pixel unit or CCD pixel unit. Each of the pixel units of the counting-like type of terahertz detector according to the present embodiment is constituted by a plurality of sub pixels. Each of the sub pixels may include no more than one signal trigger configured to transform a terahertz signal to an electrical current pulsing signal and may be a smaller pixel unit, as shown in FIG. 1. The pixel units form a planar array structure and each of the pixel units includes a plurality of sub pixels that may form a planar array structure.

The plurality of sub pixels of each of the pixel units are connected in parallel, that is, an output signal of each of the sub pixels may be superimposed or added together and a resulting output signal having a superimposed amplitude is represented as a signal of a single pixel unit. In addition, each of the pixel units outputs a signal individually. A single pixel unit includes a number of sub pixels and the number of the sub pixels is adjusted according to requirements of grey gradient or color gradient. In FIG. 1, the sub pixels in one pixel unit have a color gradient of 16×16=256.

Figure 2:
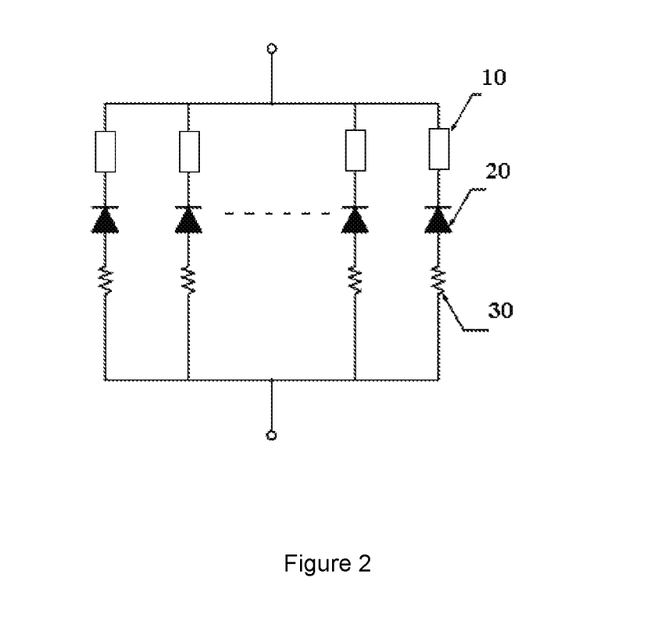
FIG. 2 illustrates an equivalent circuit diagram of a single pixel unit according to an embodiment of the present disclosure.

FIG. 2 illustrates an equivalent circuit diagram of a single pixel unit of the terahertz detector according to an embodiment of the present disclosure. As shown in FIG. 2, each of the pixel units is formed by a plurality of sub pixels that are connected in parallel. Each of the sub pixels may respectively include a terahertz wave sensitive unit 10, a Geiger avalanche photodiode 20 and quenching resistor 30. It is noted that FIG. 2 merely shows an embodiment of the present disclosure, and in other embodiments, each sub pixel may include other elements. In an embodiment, each sub pixel may include no quenching resistor 30. The sub pixels connected in parallel output a superimposed signal, which obviously is stronger than a signal outputted by any one of the sub pixels. Thus, an enhanced output signal may be obtained.

The terahertz wave sensitive unit 10 may be a Schottky diode (SBD) detector 103, a high-speed electron mobility transistor 104 (HEMT), a complementary metal oxide semiconductor (CMOS) field effect transistor 104, or may be made of a pyroelectricity material, a graphene material, or may have a structure such as a nano-line material, that may transform a terahertz signal to an electric signal. The Geiger avalanche photodiode (APD) 20 may be an avalanche photodiode that is under a breakdown state. In general, an equivalent resistance portion that is made of polysilicon or other highly-resistant material is integrated in an electrode of the Geiger avalanche photodiode 20.

Figure 3:
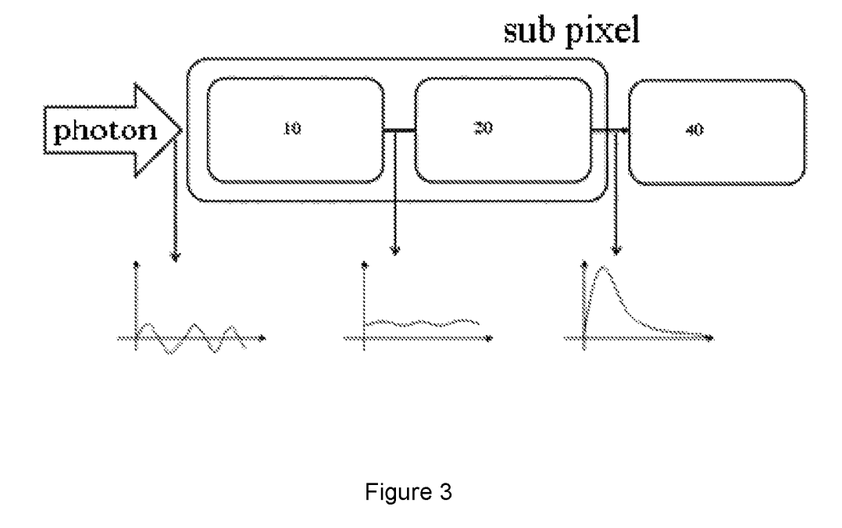
FIG. 3 shows a working principle view of a single sub pixel of a terahertz detector according to an embodiment of the present disclosure.

In order to further understand the working principle of a single sub pixel, FIG. 3 shows a working principle view of a single sub pixel of a terahertz detector according to an embodiment of the present disclosure. When a sub pixel receives no terahertz signal, the sensitive unit 10 outputs a small and weak signal and thus the Geiger avalanche photodiode 20 (APD) is still in an initial breakdown state under action of a bias voltage. When the sub pixel receives a small and weak terahertz signal, the front-end sensitive unit 10 transforms the terahertz signal to an electric signal and the electric signal may be transformed into a voltage signal and applied to the Geiger avalanche photodiode 20 (APD), such that the Geiger avalanche photodiode 20 that is in the initial breakdown state is excited to avalanche, thereby outputting a transient electrical current pulsing signal. When the electrical current increases up to a certain value, for example up to a certain threshold, a partial potential on the quenching resistor 30 will be increased gradually while a partial potential on the Geiger avalanche photodiode 20 will be decreased gradually and thus the Geiger avalanche photodiode 20 will restore the initial avalanche state. During this, the electrical current pulsing signal outputted by each of the sub pixels due to excitation of the terahertz signal may be considered as a branch signal of a pixel unit. In the embodiment, the sensitive unit 10 located at a front position transforms a weak terahertz signal to an electrical current pulsing signal and the electrical current pulsing signal, after passing through a low noise amplifier, is passed to a subsequent read circuit such that the whole image system is simplified and may directly detect a weak terahertz signal.

In the counting-like type of detector according to an embodiment of the present disclosure, integration of the sensitive unit 10 located at a front position, the Geiger avalanche photodiode 20 and the quenching resistor 30 in one sub pixel may further optimize matched impedance of the components, increase a transformation efficiency of signal and increase the whole reliability of the device.

Figure 4:
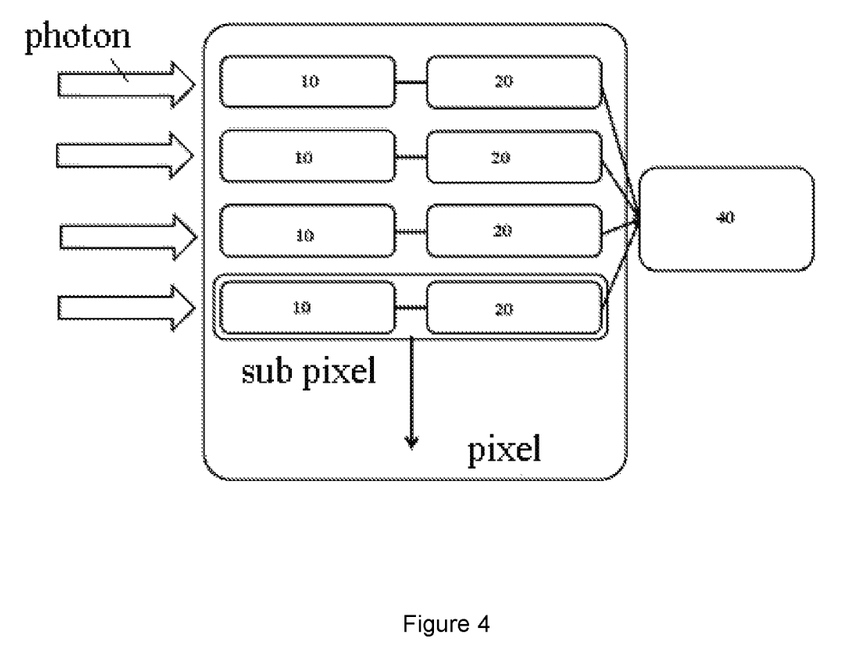
FIG. 4 shows a schematic structural view of a pixel unit of a terahertz detector according to an embodiment of the present disclosure.

Referring to FIG. 4, a working process of a single pixel unit of the counting-like type of detector according to an embodiment of the present disclosure is shown. As illustrated in the above FIG. 3, a working process of a single sub pixel is described and a single pixel unit is formed by a plurality of sub pixels that are connected in parallel. As a result, a value of an output signal of the pixel unit results from superimposing the electrical current pulsing signals outputted by the sub pixels that are excited by the terahertz signal. The amplitude of the superimposed electrical current pulsing signals is an integral times of an amplitude of the electrical current pulsing signal outputted by the single sub pixel under excitation of the terahertz signal. In other words, if the amplitude of the electrical current pulsing signal outputted by a single sub pixel is A and the pixel unit including N sub pixels is triggered by the terahertz signal, the pixel unit will output an electrical current pulsing signal having a amplitude of NA (assuming electrical current pulsing signals of the sub pixels are equal to each other). The resulting electrical current pulsing signal, having passed the low noise amplifier, is passed to the subsequent read circuit for signal processing.

It is noted that the sub pixels may respectively output electrical current pulsing signals that are different from one another. For example, in the following text, the sensitive units may be of various types. When the pixel unit includes sensitive units that are the same and have the same specifications, the amplitude of the electrical current pulsing signal outputted by the pixel unit may be NA. If the sensitive units have different specifications, the amplitude of the electrical current pulsing signal outputted by the pixel unit may be a superimposed value of the amplitudes of the electrical current pulsing signals outputted by the sensitive units. Embodiments of the present disclosure include a plurality of sub pixels that may be formed by various types of sensitive units and form a pixel unit.

The sensitive unit 10 located in the front position in the embodiment may be provided with an antenna structure to enhance collection of the terahertz signal. In addition, a size of the sensitive unit 10 may be determined according to a structure and size of the sub pixel. In a situation where space is limited, the antenna structure may be replaced by a super material to enhance collection of the terahertz signal. In an embodiment, the sensitive unit 10 includes an antenna with a microstructure configured to enhance a terahertz signal towards at least one point of the sensitive unit 10. The microstructure of the antenna may be varied, such as a staircase structure or a pattern structure. By configuring a suitable microstructure, the antenna may enhance a signal towards one or more points of the antenna when collecting a terahertz signal, thereby achieving in the end an improvement of detecting accuracy. Various embodiments of the sensitive unit 10 are provided herein. However, the sensitive unit 10 in the present disclosure is not limited to the type disclosed herein.

FIGS. 5-10 illustrate cross sectional views of the sub pixel of the terahertz detector according to embodiments of the present disclosure.

Figure 5:
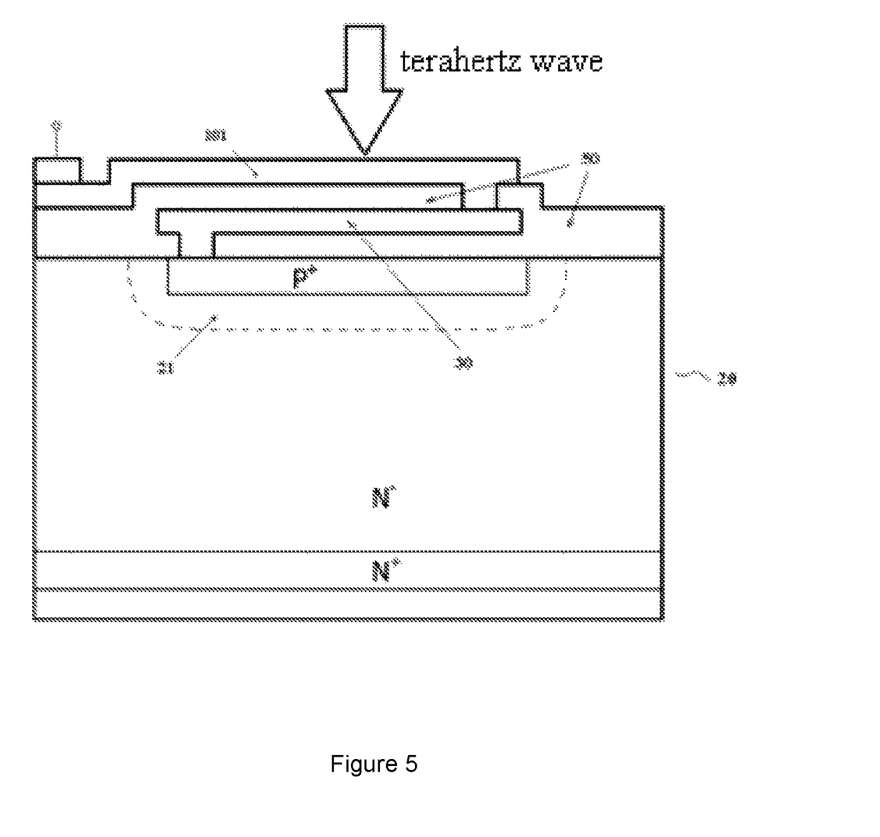
FIG. 5 shows a schematic structural cross sectional view of a sub pixel according to an embodiment of the present disclosure.

FIG. 5 shows an embodiment in which the sensitive unit 10 includes graphene material 101. In the embodiment, a terahertz signal may be incident on a top face of the graphene material directly, or alternatively, the terahertz signal may be focused by a lens structure and then passed to the top face of the graphene material, increasing collecting efficiency of the terahertz signal. The graphene material 101 is connected in series with the quenching resistor 30, which is formed from a polysilicon material or a highly-resistant material, and the quenching resistor 30 is connected in series with an avalanche photodiode 20 (APD). The avalanche photodiode 20 may include a P+ area, an N− area and an N+ area. When a positive bias voltage is applied to an electrode at the N+ area and is greater than a breakdown voltage of the avalanche photodiode 20 (APD), the avalanche photodiode 20 (APD) is put into a breakdown state. Commonly, the bias voltage is greater than the breakdown by 3-5 V. The area marked by dash line and denoted by 21 in FIG. 5 is a depletion region.

In the embodiment as shown in FIG. 5, the sub pixel of the terahertz detector may further include a passivation layer 50 configured to separate the graphene material 101 from the avalanche photodiode 20. The quenching resistor 30 may be surrounded by the passivation layer 50.

Figure 6:
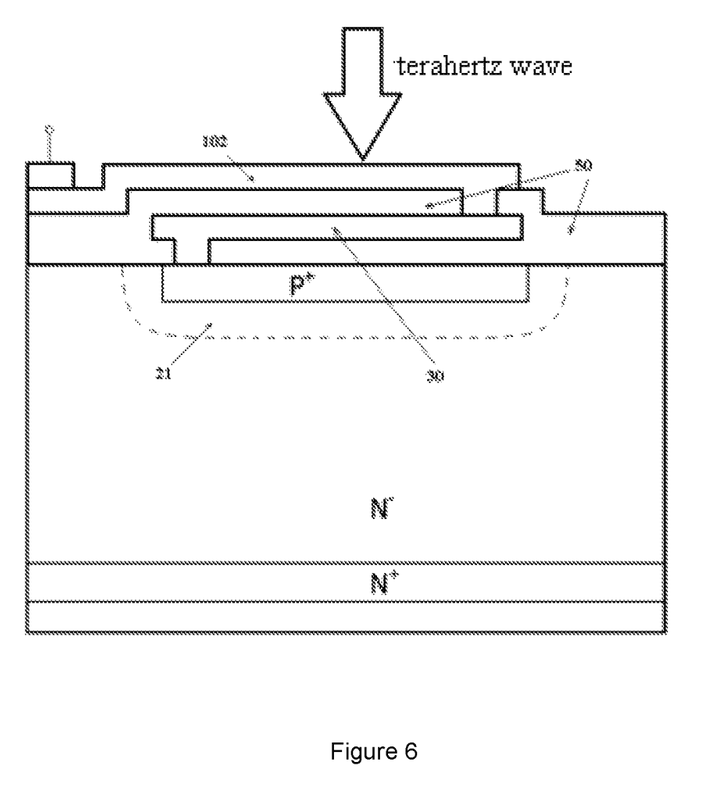
FIG. 6 shows a schematic structural cross sectional view of a sub pixel according to an embodiment of the present disclosure.

FIG. 6 shows an embodiment in which the sensitive unit 10 includes pyroelectricity material 102. The embodiment in FIG. 6 is similar to that in FIG. 5, except that the sensitive unit 10 includes pyroelectricity material 102. In the embodiment, a terahertz signal may be incident on a top face of the pyroelectricity material 102 directly. In an embodiment, a lens may be provided such that a terahertz signal may be focused by the lens and then passed to the top face of the pyroelectricity material 102, increasing the collecting efficiency of the terahertz signal. The pyroelectricity material 102 is connected in series with the quenching resistor 30, which is formed from a polysilicon material or a highly-resistant material, and the quenching resistor 30 is connected in series with an avalanche photodiode 20 (APD).

In the embodiment as shown in FIG. 6, the sub pixel of the terahertz detector may further include a passivation layer 50 configured to separate the pyroelectricity material 102 from the avalanche photodiode 20. The quenching resistor 30 may be surrounded by the passivation layer 50.

Figure 7:
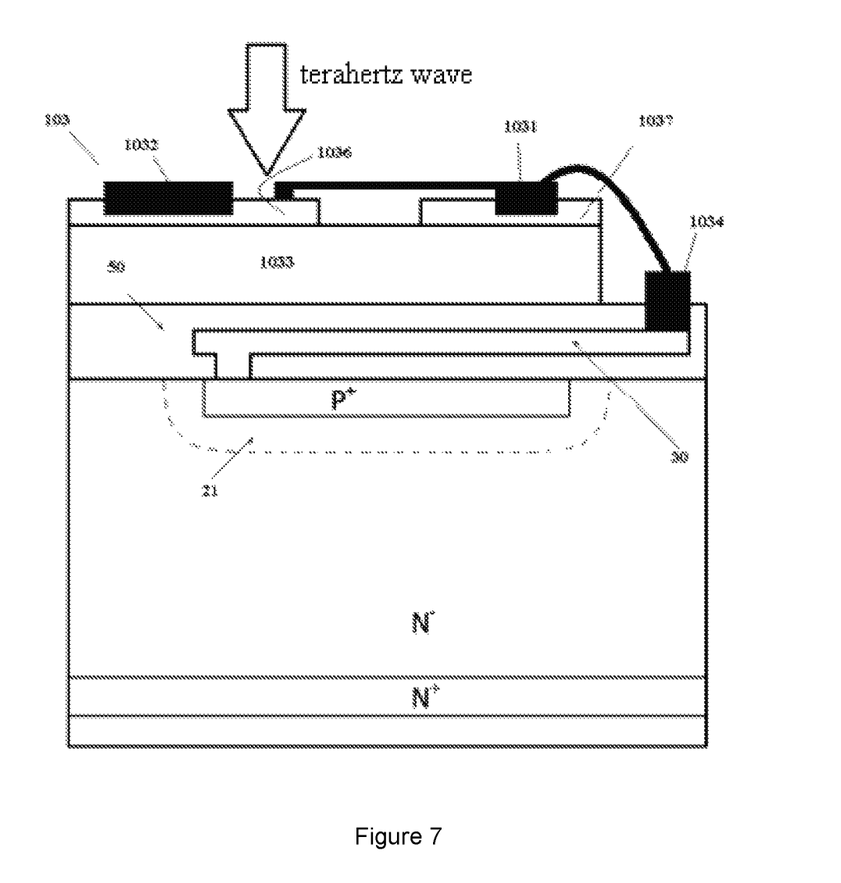
FIG. 7 shows a schematic structural cross sectional view of a sub pixel according to an embodiment of the present disclosure.

FIG. 7 shows an embodiment in which the sensitive unit 10 includes a Schottky diode detector 103 (SBD). The embodiment in FIG. 7 is similar to that in FIG. 5, except that the sensitive unit 10 includes a Schottky diode detector 103 (SBD). The Schottky diode detector 103 (SBD) may be made of silicon or a compound semiconductor material 1033, such as gallium arsenide, gallium nitride, or silicon carbide. The terahertz electromagnetic wave may be incident on a top face of the Schottky diode detector 103 directly. In an embodiment, a lens may be provided such that a terahertz electromagnetic wave may be focused by the lens and then passed to the top face of the Schottky diode detector 103, increasing the collecting efficiency of the terahertz signal. The Schottky diode detector 103 is connected in series with the quenching resistor 30, which is formed from a polysilicon material or a highly-resistant material, and the quenching resistor 30 is connected in series with an avalanche photodiode 20 (APD). Herein, the Schottky diode detector 103 may be directly grown on the structure of the avalanche photodiode 20 and the quenching resistor 30, or alternatively, a Schottky diode detector 103 may be grown separately and then be bonded to the structure of the avalanche photodiode 20 and the quenching resistor 30. Then, an electrode of the pixel unit is connected in series with the quenching resistor 30, which is formed from a polysilicon material or a highly-resistant material, by a metal wire.

In the embodiment as shown in FIG. 7, the sub pixel of the terahertz detector may further include a passivation layer 50 configured to separate a gallium arsenide/gallium nitride layer 1033 of the Schottky diode detector 103 from the quenching resistor 30, which is formed from a polysilicon material or a highly-resistant material. The quenching resistor 30 may be surrounded by the passivation layer 50. Specifically, the Schottky diode detector 103 may include a gallium arsenide (GaAs) layer 1036 at a low concentration dopant, another GaAs layer 1037, a cathode 1032 disposed on the GaAs layer 1036 and an anode 1031 disposed on the GaAs layer 1037 through an ohmic contact, which face the terahertz signal. The Schottky diode detector 103 may further include a step at an edge at a side face of the Geiger avalanche photodiode 20 and an electrode pad 1034 disposed on the step. The anode 1031 of the Schottky diode detector 103 is electrically connected to the electrode pad 1034. The Schottky diode detector 103 further includes a GaAs layer (or may be a gallium nitride layer) 1033 and the GaAs layer 1036 and the GaAs layer 1037 are disposed on the GaAs layer 1033. The electrode pad 1034 is electrically connected to the quenching resistor 30 through a via hole.

Figure 8:
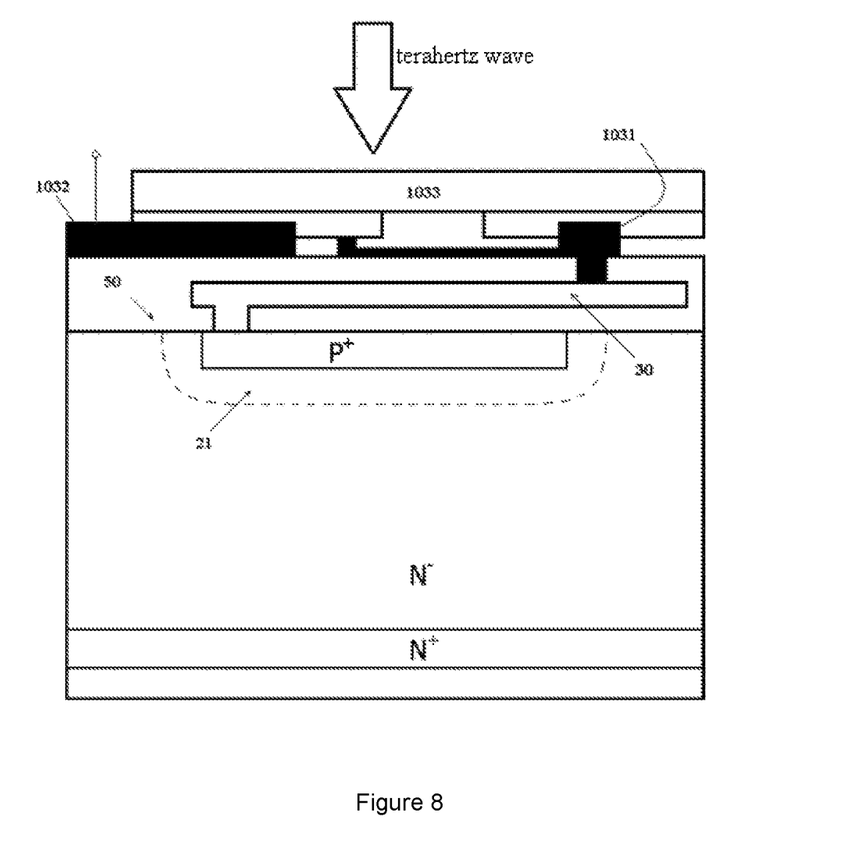
FIG. 8 shows a schematic structural cross sectional view of a sub pixel according to an embodiment of the present disclosure.

FIG. 8 shows an embodiment in which the sensitive unit 10 includes a Schottky diode detector 103 (SBD). The Schottky diode detector 103 (SBD) may be made of silicon or a compound semiconductor material 1033, such as gallium arsenide, gallium nitride, or silicon carbide. The embodiment of FIG. 8 is similar to that of FIG. 7, except that the Schottky diode detector 103 (SBD) is mounted in a reverse manner relative to the embodiment as shown in FIG. 7, that is, the anode 1031 and the cathode 1032 of the Schottky diode detector 103 face the Geiger avalanche photodiode 20. The anode 1031 of the Schottky diode detector 103 is electrically connected to the Geiger avalanche photodiode 20 through the quenching resistor 30. As shown in FIG. 8, the anode 1031 of the Schottky diode detector 103 is directly electrically connected to the quenching resistor 30 through a via hole in the passivation layer 50. The terahertz electromagnetic wave may be directly incident on the gallium arsenide/gallium nitride layer 1033 on a back side of the Schottky diode detector 103 and pass through the substrate so as to be collected. In an embodiment, a lens may be provided such that a terahertz electromagnetic wave may be focused by the lens and then passed to the gallium arsenide/gallium nitride layer 1033 on the back side of the Schottky diode detector 103 and pass through the substrate so as to be collected, increasing the collecting efficiency of the terahertz signal. The Schottky diode detector 103 is connected in series with the quenching resistor 30, which is formed from a polysilicon material or a highly-resistant material, and the quenching resistor 30 is connected in series with an avalanche photodiode 20 (APD). Herein, the Schottky diode detector 103 may be formed separately and provided with electrodes, and then be bonded in an inverted alignment process to the quenching resistor 30 that is grown on the avalanche photodiode 20. Then the other electrode of the Schottky diode detector 103 is led out by a metal wire.

In the embodiments as shown in FIG. 7 and FIG. 8, it is an advantage that the sensitive unit 10 is a Schottky diode detector 103. The Geiger avalanche photodiode 20 may be formed by a mature silicon process, or may be made of a compound semiconductor material such as gallium arsenide, gallium nitride or silicon nitride, in which the process may be selected and adjusted according to specifications, process difficulty and cost. Meanwhile, the Schottky diode detector 103 may also be formed by a mature silicon process. Therefore, the whole sub pixel may be formed by a mature semiconductor manufacturing process, which may reduce manufacturing cost and increase reliability of the product.

Figure 9:
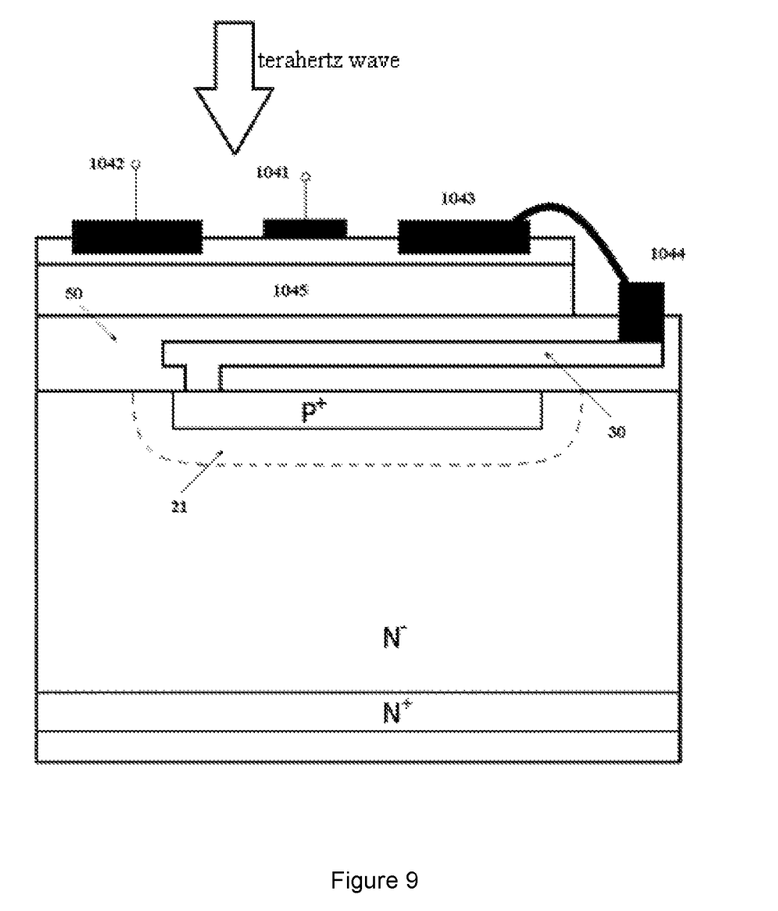
FIG. 9 shows a schematic structural cross sectional view of a sub pixel according to an embodiment of the present disclosure.

FIG. 9 shows an embodiment in which the sensitive unit 10 is a high-speed electron mobility transistor 104 (HEMT). The high-speed electron mobility transistor 104 (HEMT) may be made by silicon or a compound semiconductor material 1045, such as gallium arsenide, gallium nitride or silicon carbide. The terahertz electromagnetic wave may be incident on a top face of the high-speed electron mobility transistor 104 (HEMT) directly. In an embodiment, a lens may be provided such that a terahertz electromagnetic wave may be focused by the lens and then passed to the top face of the high-speed electron mobility transistor 104 (HEMT), increasing the collecting efficiency of the terahertz signal. A gate of the high-speed electron mobility transistor 104 can be controlled individually. When the incident terahertz signal enters the high-speed electron mobility transistor 104 from a gate 1041 and a source electrode 1042, a two dimensional electron gas within the high-speed electron mobility transistor 104 is modulated in a self-mixing mode such that an electric signal is outputted from a drain electrode 1043. Herein, the high-speed electron mobility transistor 104 may be directly grown on the structure of the avalanche photodiode 20 and the quenching resistor 30, or alternatively, a high-speed electron mobility transistor 104 may be grown separately and then be bonded to the structure of the avalanche photodiode 20 and the quenching resistor 30. Then an electrode of the pixel unit is connected in series with the quenching resistor 30, which is formed from a polysilicon material or a highly-resistant material, by a metal wire 1044.

Figure 10:
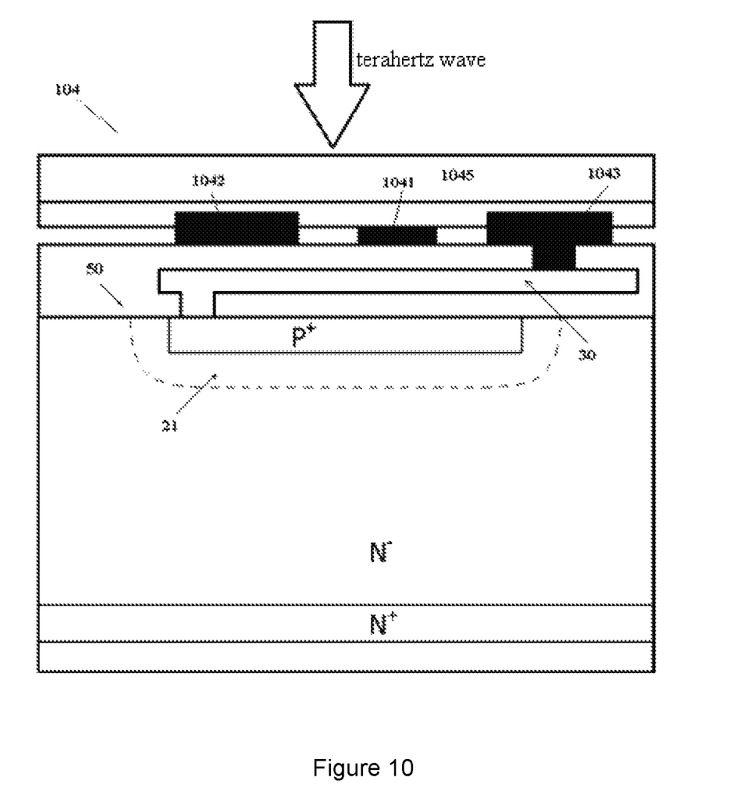
FIG. 10 shows a schematic structural cross sectional view of a sub pixel according to an embodiment of the present disclosure.

FIG. 10 shows an embodiment in which the sensitive unit 10 is a high-speed electron mobility transistor 104 (HEMT). The embodiment of FIG. 10 is similar to that in FIG. 9 except that the high-speed electron mobility transistor 104 (HEMT) is mounted in a reverse manner relative to FIG. 9. The high-speed electron mobility transistor 104 (HEMT) may be formed of silicon or of a compound semiconductor material 1045, such as gallium arsenide, gallium nitride or silicon carbide. The terahertz electromagnetic wave may be incident on the compound semiconductor 1045 on a back face of the high-speed electron mobility transistor 104 (HEMT) directly and pass through the substrate so as to be collected. In an embodiment, a lens may be provided such that a terahertz electromagnetic wave may be focused by the lens and then be incident on the back face of the high-speed electron mobility transistor 104 (HEMT) and pass through the substrate so as to be collected, increasing the collecting efficiency of the terahertz signal. The high-speed electron mobility transistor 104 is connected in series with the quenching resistor 30, which is formed from a polysilicon material or a highly-resistant material, and the quenching resistor 30 is connected in series with an avalanche photodiode 20 (APD). The high-speed electron mobility transistor 104 may be formed separately and provided with electrodes, and then be bonded in an inverted alignment process to the quenching resistor 30 that is grown on the avalanche photodiode 20. Then the other electrode of the high-speed electron mobility transistor 104 is led out by a metal wire. Specifically, a gate electrode 1041, a source electrode 1042 and a drain electrode 1043 of the high-speed electron mobility transistor 104 face the avalanche photodiode 20. The gate electrode 1041 and the source electrode 1042 of the high-speed electron mobility transistor 104 abut against the passivation layer 50 and the drain electrode 1043 of the high-speed electron mobility transistor 104 is electrically connected to the quenching resistor 30 through a via hole in the passivation layer 50.

In the disclosure, the front-end sensitive unit 10 may be any one of the graphene material, the pyroelectricity material, the Schottky diode detector 103, the high-speed electron mobility transistor 104, or other sensitive unit that may directly or indirectly transform the terahertz signal to an electrical signal. The sub pixel in the disclosure has a flexible structure and other sensitive units 10 with a currently new structure may be implemented in the sub pixel. In addition, the sub pixel in the disclosure may further operate at a low temperature so that an increased sensitivity can be reduced while reducing noise of the avalanche photodiode 20, achieving increased detecting properties as a whole.

In the present disclosure, the counting-like type of detection technique is used such that a detection efficiency for a terahertz signal is increased while detection precision is increased.

In order to assist in understanding the terahertz detector according to the embodiments of the present disclosure, an operation process of the terahertz detector is described.

The operation process of the terahertz detector according to the embodiments is as follows:

When the pixel unit receives no terahertz signal, the sensitive unit 10 outputs a small and weak signal and thus the Geiger avalanche photodiode 20 (APD) is still in an initial breakdown state under action of a bias voltage; when the sub pixel receives an even very small and weak terahertz signal, the sensitive unit 10 transforms the terahertz signal to an electric signal that can be detected, and the electric signal may be transformed into a voltage signal and applied to the Geiger avalanche photodiode 20 (APD), such that the Geiger avalanche photodiode 20 that is in the initial breakdown state is excited to avalanche, thereby outputting a transient electrical current pulsing signal; when the electrical current increases up to a certain value, a partial potential on the quenching resistor 30 will be increased gradually while a partial potential on the Geiger avalanche photodiode 20 (APD) will be decreased gradually and thus the Geiger avalanche photodiode 20 (APD) will restore the initial avalanche state. During this, the electrical current pulsing signal outputted by each of the sub pixels due to excitation by the terahertz signal may be considered as a sub signal or a branch signal of a pixel unit.

Each of the pixel units is formed by a plurality of sub pixels connected in parallel together. With this configuration, the value of the outputted signal of a single pixel unit is a resulting value obtained by superimposing electrical current pulsing signals outputted by the plurality of sub pixels under excitation of the terahertz signal and the amplitude of the superimposed electrical current pulsing signals is an integral times of an amplitude of the electrical current pulsing signal outputted by the single sub pixel under excitation of the terahertz signal. In other words, if the amplitude of the electrical current pulsing signal outputted by a single sub pixel is A and the pixel unit including N sub pixels is triggered by a terahertz signal, the pixel unit will output an electrical current pulsing signal having a amplitude of NA. The resulting electrical current pulsing signal, after having passed a low noise amplifier, is passed to a subsequent read circuit for signal processing. It is shown in practice that the final electrical current pulsing signal obtained in the embodiments is strong and the detector sensitivity is high.

Although some embodiments according to a general concept of the present disclosure have been revealed and described, it is understood that these embodiments may be modified without departing from the principles and spirit of the present disclosure. The scope of the present disclosure is defined by the claims and their equivalents.

The invention claimed is:

1. A terahertz detector comprising a planar array structure comprising a plurality of pixel units, wherein the plurality of pixel units each comprise N sub pixels and each of the sub pixels comprises no more than one signal trigger configured to transform a terahertz signal to an electrical current pulsing signal, and each of the plurality of pixel units detects a signal that is a sum of the electrical current pulsing signals of the N sub pixels, where N is an integer greater than 1, and wherein each of the pixel units comprises:

a sensitive unit configured to transform a terahertz signal received to an electrical signal; and a Geiger avalanche photodiode, wherein the sensitive unit is electrically connected to the Geiger avalanche photodiode, and at least one of such pixel units is configured:

such that the Geiger avalanche photodiode is in an initial breakdown state under a bias voltage in a case where the sensitive unit receives essentially no terahertz signal, and such that in a case where the sensitive unit receives a terahertz signal, the sensitive unit transforms the terahertz signal to an electrical signal that is detectable and the electrical signal is further transformed to a voltage signal and then is applied to the Geiger avalanche photodiode so as to excite the Geiger avalanche photodiode to avalanche and output a transient electrical current pulsing signal.

2. The terahertz detector as claimed in claim 1, wherein each of the sub pixels further comprises a quenching resistor, and the sensitive unit, the Geiger avalanche photodiode and the quenching resistor are connected in series, and each of the sub pixels is configured such that:

in a case where a value of an electrical current in a circuit reaches a threshold value, a partial potential on the quenching resistor increases gradually, a partial potential on the avalanche photodiode decreases gradually and the avalanche photodiode restores to the initial avalanche state.

3. The terahertz detector as claimed in claim 2, wherein the sensitive unit comprises any one, or a combination of more than one, from a graphene material, a pyroelectricity material, a Schottky diode detector, and/or a high-speed electron mobility transistor.

4. The terahertz detector as claimed in claim 3, wherein the sensitive unit comprises the Schottky diode detector and the Schottky diode detector includes a diode body, and an anode and a cathode disposed on one side of the diode body.

5. The terahertz detector as claimed in claim 4, wherein the anode and the cathode of the Schottky diode detector face towards the terahertz signal, the terahertz detector further comprises a step on a surface of the Geiger avalanche photodiode and an electrode pad disposed on the step, and the anode of the Schottky diode detector is electrically connected to the electrode pad; or
wherein the anode and the cathode of the Schottky diode detector face towards the Geiger avalanche photodiode and the anode of the Schottky diode detector is electrically connected to the Geiger avalanche photodiode through the quenching resistor.

6. The terahertz detector as claimed in claim 3, wherein the sensitive unit comprises the high-speed electron mobility transistor and the high-speed electron mobility transistor includes a transistor body and a source electrode, drain electrode and a gate electrode disposed on a side face of the transistor body, wherein
a side face of the transistor body of the high-speed electron mobility transistor faces towards the Geiger avalanche photodiode, or
a side face, on which the source electrode, the drain electrode and the gate electrode are not disposed, of the transistor body of the high-speed electron mobility transistor faces towards the Geiger avalanche photodiode.

7. The terahertz detector as claimed in claim 1, wherein the sensitive unit comprises an antenna having a microstructure configured to enhance a terahertz signal towards at least one point.

8. The terahertz detector as claimed in claim 7, wherein the microstructure of the antenna is of a staircase structure, a pattern structure or a super material.

9. The terahertz detector as claimed in claim 1, further comprising a sensitive unit lens, through which the terahertz signal passes and impinges on the sensitive unit.

10. The terahertz detector as claimed in claim 1, wherein the Geiger avalanche photodiode is made of a semiconductor material including silicon, gallium arsenide, gallium nitride, silicon carbide, graphene or indium phosphide.

11. The terahertz detector as claimed in claim 1, further comprising a passivation layer disposed between the sensitive unit and a quenching resistor.

12. The terahertz detector as claimed in claim 2, wherein the quenching resistor includes a polysilicon material or other highly-resistant material.

13. A terahertz detector comprising a planar array structure comprising a plurality of pixel units, wherein the plurality of pixel units each comprise two or more sub pixels and each of the sub pixels comprises a signal trigger configured to transform a terahertz signal to an electrical current pulsing signal, and each of the plurality of pixel units detects a signal that is a combination of the electrical current pulsing signals of the sub pixels of that pixel unit,
wherein the sub pixels of each of the pixel units are connected in parallel, and
wherein each of the pixel units comprises:
a sensitive unit configured to transform a terahertz signal received to an electrical signal; and
a Geiger avalanche photodiode,
wherein the sensitive unit is electrically connected to the Geiger avalanche photodiode, and at least one of such pixel units is configured:
such that the Geiger avalanche photodiode is in an initial breakdown state under a bias voltage in a case where the sensitive unit receives essentially no terahertz signal, and
such that in a case where the sensitive unit receives a terahertz signal, the sensitive unit transforms the terahertz signal to an electrical signal that is detectable and the electrical signal is further transformed to a voltage signal and then is applied to the Geiger avalanche photodiode so as to excite the Geiger avalanche photodiode to avalanche and output a transient electrical current pulsing signal.

14. The terahertz detector as claimed in claim 13, wherein each of the sub pixels further comprises a quenching resistor, and the sensitive unit, the Geiger avalanche photodiode and the quenching resistor are connected in series, and
each of the sub pixels is configured such that:
in a case where a value of an electrical current in a circuit reaches a threshold value, a partial potential on the quenching resistor increases gradually, a partial potential on the avalanche photodiode decreases gradually and the avalanche photodiode restores to the initial avalanche state.

15. A terahertz detector comprising a planar array structure comprising a plurality of pixel units, wherein the plurality of pixel units each comprise two or more sub pixels and each of the sub pixels comprises a signal trigger configured to transform a terahertz signal to an electrical current pulsing signal, and each of the plurality of pixel units detects a signal that is a combination of the electrical current pulsing signals of the sub pixels of that pixel unit,
wherein each of the pixel units comprises:
a sensitive unit configured to transform a terahertz signal received to an electrical signal; and
a Geiger avalanche photodiode,
wherein the sensitive unit is electrically connected to the Geiger avalanche photodiode, and at least one of such pixel units is configured:
such that the Geiger avalanche photodiode is in an initial breakdown state under a bias voltage in a case where the sensitive unit receives essentially no terahertz signal, and
such that in a case where the sensitive unit receives a terahertz signal, the sensitive unit transforms the terahertz signal to an electrical signal that is detectable and the electrical signal is further transformed to a voltage signal and then is applied to the Geiger avalanche photodiode so as to excite the Geiger avalanche photodiode to avalanche and output a transient electrical current pulsing signal.

16. The terahertz detector as claimed in claim 15, wherein each of the sub pixels further comprises a quenching resistor, and the sensitive unit, the Geiger avalanche photodiode and the quenching resistor are connected in series, and
each of the sub pixels is configured such that:
in a case where a value of an electrical current in a circuit reaches a threshold value, a partial potential on the quenching resistor increases gradually, a partial potential on the avalanche photodiode decreases gradually and the avalanche photodiode restores to the initial avalanche state.

17. The terahertz detector as claimed in claim 15, wherein the sensitive unit comprises a Schottky diode detector and the Schottky diode detector includes a diode body, and an anode and a cathode disposed on one side of the diode body.

18. The terahertz detector as claimed in claim 15, wherein the sensitive unit comprises a high-speed electron mobility transistor and the high-speed electron mobility transistor includes a transistor body and a source electrode, drain electrode and a gate electrode disposed on a side face of the transistor body, wherein
- a side face of the transistor body of the high-speed electron mobility transistor faces towards the Geiger avalanche photodiode, or
- a side face, on which the source electrode, the drain electrode and the gate electrode are not disposed, of the transistor body of the high-speed electron mobility transistor faces towards the Geiger avalanche photodiode.

19. The terahertz detector as claimed in claim 15, wherein the sensitive unit comprises an antenna having a microstructure configured to enhance a terahertz signal towards at least one point.

20. The terahertz detector as claimed in claim 15, further comprising a sensitive unit lens, through which the terahertz signal passes and impinges on the sensitive unit.

* * * * *